(12) United States Patent
Matsushita

(10) Patent No.: US 8,482,354 B2
(45) Date of Patent: Jul. 9, 2013

(54) POWER AMPLIFYING DEVICE AND COUPLED POWER AMPLIFYING DEVICE

(75) Inventor: Keiichi Matsushita, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 26 days.

(21) Appl. No.: 13/192,751

(22) Filed: Jul. 28, 2011

(65) Prior Publication Data

US 2012/0133440 A1 May 31, 2012

(30) Foreign Application Priority Data

Nov. 26, 2010 (JP) ................................ 2010-263451

(51) Int. Cl.
*H03F 3/18* (2006.01)
(52) U.S. Cl.
USPC ........................................................ 330/307
(58) Field of Classification Search
USPC ........................................ 330/277, 295, 307
See application file for complete search history.

(56) References Cited

U.S. PATENT DOCUMENTS

| 5,883,407 | A | 3/1999 | Kunii et al. | |
| 6,252,266 | B1 | 6/2001 | Hoshi et al. | |
| 7,511,575 | B2 * | 3/2009 | Gotou et al. | 330/295 |

FOREIGN PATENT DOCUMENTS

| GB | 2 278 017 A1 | 11/1994 |
| JP | 6-37308 | 2/1994 |
| JP | 07-235554 A | 9/1995 |
| JP | 2000-138236 A | 5/2000 |
| JP | 2008-042184 A | 2/2008 |
| JP | 2010-11469 A | 1/2010 |

OTHER PUBLICATIONS

Office Action issued Sep. 18, 2012 in Japanese Patent Application No. 2010-263451 with English language translation.
European Search Report and Extended European Search Report dated Jan. 17, 2013, in European Patent Application No. 11175178.0.
T. Suzuki et al., "Plated Source Bridge (PSB) GaAs Power FET with Improved Reliability", IEEE International Microwave Symposium Digest, Jun. 15, 1981, XP 002034559, pp. 34-36.

* cited by examiner

*Primary Examiner* — Steven J Mottola
(74) *Attorney, Agent, or Firm* — Oblon, Spivak, McClelland, Maier & Neustadt, L.L.P.

(57) ABSTRACT

A power amplifying device includes earth parts which are connected with via holes for grounding, source electrode earth conductors which connect the earth parts, source electrodes which are coupled to the source electrode earth conductors, an inner source electrode which is not in contact with the source electrode earth conductors, a drain electrode, a gate electrode and an air bridge which directly connects the inner source electrode and earth parts.

9 Claims, 3 Drawing Sheets

POWER AMPLIFYING DEVICE AND COUPLED POWER AMPLIFYING DEVICE

CROSS-REFERENCE TO RELATED APPLICATIONS

This application is based upon and claims the benefit of priority from the prior Japanese Patent Application No. 2010-263451, filed on 26 Nov., 2010, and the entire contents of which are incorporated herein by reference.

FIELD

The embodiment of the present invention relates to a power amplifying device and a coupled power amplifying device.

BACKGROUND

A power amplifying element includes a drain electrode, a gate electrode, and a source electrode. A high frequency amplifying device includes a plurality of power electrifying elements connected in parallel to obtain a high gain.

When a plurality of drain electrodes of this high frequency amplifying device is connected in one direction and a plurality of gate electrodes is connected in the other direction, an isolated source electrode is left when the number of power amplifying elements is four or more, and there is an issue of how to ground this isolated source electrode.

With a conventional high frequency amplifying device, in order to ground this isolated source electrode, a coupling part for grounding source electrodes at both ends of a plurality of power amplifying elements connected in parallel and this isolated source electrode are connected by plating wiring crossing a pair of a drain electrode and a gate electrode. This plating wiring is referred to as air plating wiring or air bridge.

However, if the air bridge is used, the distances from the isolated source electrode to via holes for grounding become long. When the distances from the source electrode to the via holes become long, there is an issue that an inductance occurs at a high frequency and a gain of the high frequency amplifying device decreases.

An amplifying device is demanded which further reduces the distances from the source electrode to the via holes, and reduces an influence of an inductance as much as possible.

DETAILED DESCRIPTION

Throughout this description, the embodiments and examples shown should be considered as exemplars, rather than limitations on the device and methods of the present embodiments.

Hereinafter, an embodiment of a power amplifying device will be described in detail with reference to drawings.

The power amplifying device according to the present embodiment includes a drain electrode which is provided on a substrate, a plurality of drain fingers which is connected to the drain electrode and which has front ends branched in a comb shape, a gate electrode which faces the drain electrode and which is provided on the substrate, a plurality of gate fingers which is connected to the gate electrode and which is arranged on both sides of each drain finger, source electrodes which are arranged parallel outside the gate fingers, source electrode earth conductors which are connected to source electrodes of the source electrodes arranged outside the gate fingers arranged on both sides of the gate electrode, and which are arranged in parallel to the source electrodes, pairs of earth parts which are connected to both ends of the source electrode earth conductors and are connected with via holes for grounding, an inner source electrode of the source electrodes which is arranged between a pair of source electrode earth conductors, and an air bridge which directly connects the inner source electrode and earth parts.

Figure 1:
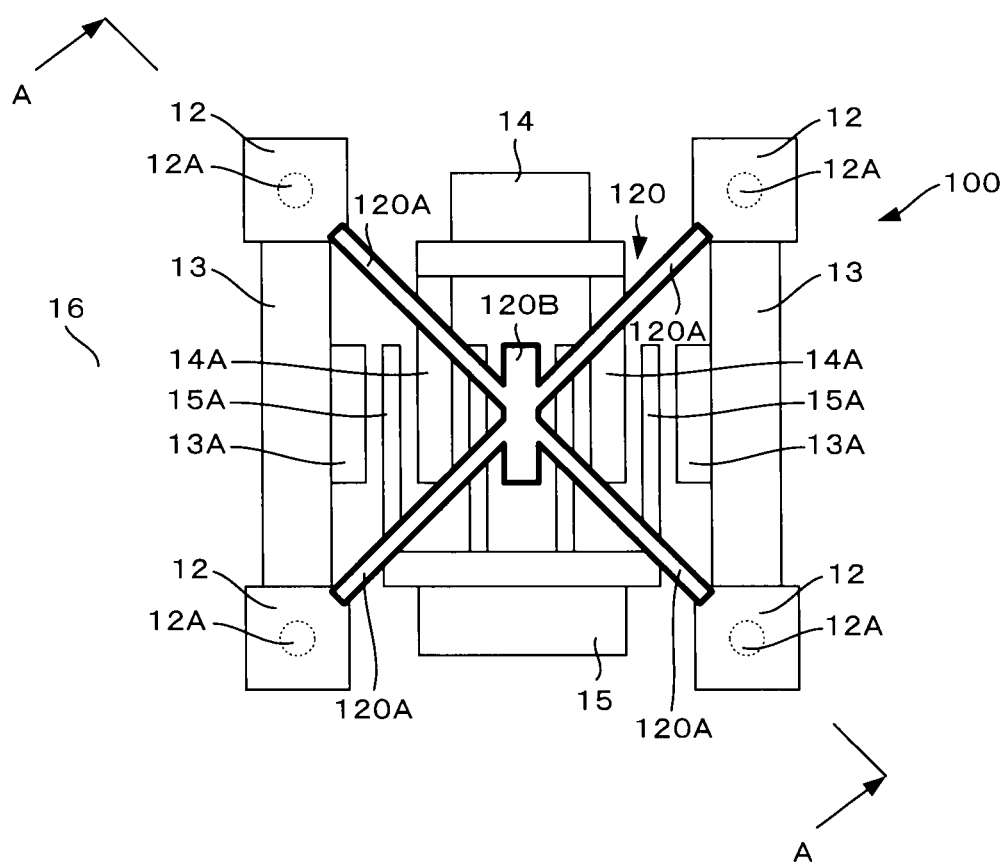
FIG. 1 is a view showing a configuration of a power amplifying device according to a first application example.
Figure 4:
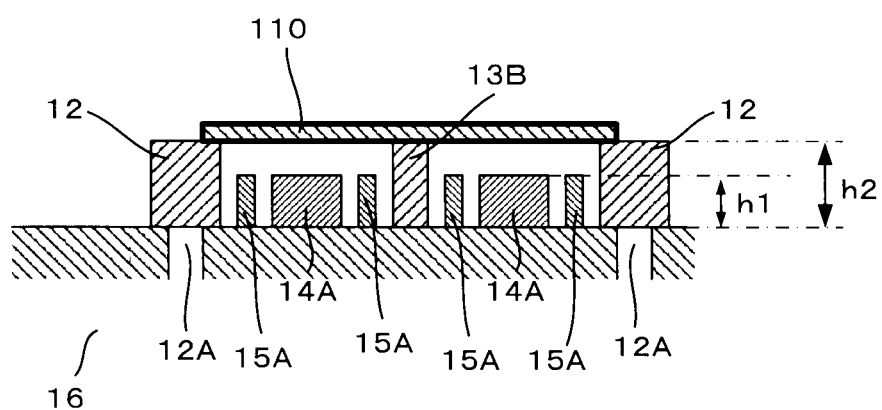
FIG. 4 is a view showing a configuration of a power amplifying device which can be commonly realized in each application example.

FIG. 1 is a view showing a configuration of a power amplifying device 100 according to a first application example of the present embodiment. As shown in FIGs. 1 and 4, the power amplifying device 100 includes pairs of earth parts 12 which are connected to the via holes 12A for grounding, source electrode earth conductors 13 which are provided on a substrate 16 and which connect these pairs of earth parts 12, source electrodes 13A which are coupled to the source electrode earth conductors 13, an inner source electrode 13B which is not in contact with the source electrode earth conductors 13, a drain electrode 14, a gate electrode 15, and an air bridge 110 which directly connects the inner source electrode 13B and the earth parts 12.

The drain electrode 14 includes a plurality of drain fingers 14A of a comb shape. The gate electrode 15 includes a plurality of gate fingers of a comb shape.

There are gaps between the source electrodes 13A and gate fingers 15A, the gate fingers 15A and the drain fingers 14A, and the drain fingers 14A and the inner source electrode 13B, respectively.

The air bridge 110 is formed with a conductor. This conductor contains gold.

The power amplifying device 100 includes at least four earth parts 12. Hence, the power amplifying device 100 includes at least two source electrode earth conductors 13. The power amplifying device 100 includes the source electrode earth conductors 13 in parallel.

The power amplifying device 100 includes the drain fingers 14A having front ends of a comb shape in the drain electrode 14. The power amplifying device 100 includes the gate fingers 15A having front ends of a comb shape in the gate electrode 15. The number of gate fingers 15A is double as many as the number of drain fingers 14A.

The power amplifying device 100 includes two gate fingers 15A between the source electrode 13A and the inner source electrode 13B and includes one drain finger 14A between these two gate fingers 15A.

According to this arrangement, with the example shown in FIG. 1, the power amplifying device 100 includes four sets of source electrodes, gate electrodes, and drain electrodes.

The inner source electrode 13B and the earth parts 12 are directly connected by the air bridge 110 including a plurality of plating wirings 11. The "directly connected" herein means the connection without at least source electrode earth conductors 13.

The center of the inner source electrode 13B in a longitudinal direction is connected with the earth parts 12 at the shortest distance. In this case, the four earth parts 12 are diagonally connected.

The power amplifying device 100 includes the integrally formed air bridge 120. The air bridge 120 has a center part 120B connected with the inner source electrode 13B, and connection bridges 120A formed on lines connecting the center of the inner source electrode 13B in the longitudinal direction with the earth parts 12 at the shortest distance.

In addition, the air bridge 120 can be integrally formed, or can be formed by connecting the connection bridges 120A to the center part 120B later. The shape of the center part 120B is by no means limited. The center part 120B may also adopt the same shape as the inner source electrode 13B.

The connection bridge 120A is directly connected to each earth part 12. With the example shown in FIG. 2, the air bridge 120 includes four connection bridges 120A. In addition, the number of connection bridges 120A can be increased or decreased within the range of limitation of design.

As described above, with the first application example, the power amplifying device 100 includes the connection bridge 110 which connects the center of the inner source electrode 13B in the longitudinal direction with the earth parts 12 at the shortest distance.

Consequently, the distances from the inner source electrode 13B to the via holes 12A become the shortest, so that it is possible to minimize the influence of an inductance due to arrangement of plating wirings, which provides an effect of preventing a decrease in a gain of a high frequency amplifying device.

Figure 2:
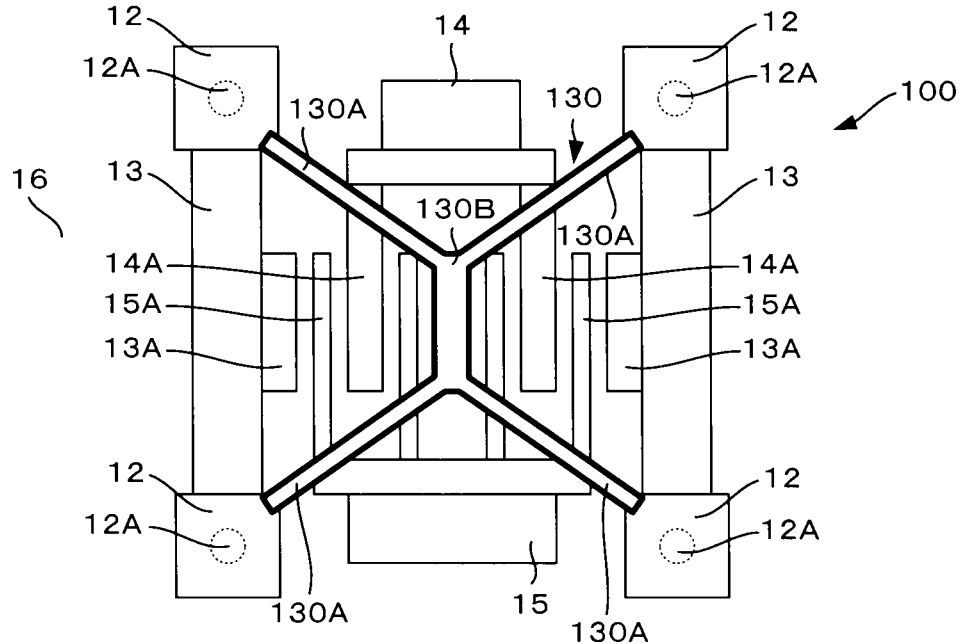
FIG. 2 is a view showing a configuration of a power amplifying device according to a second application example.

FIG. 2 is a view showing a configuration of the power amplifying device 100 according to a second application example. As shown in FIG. 2, the power amplifying device 100 includes the earth parts 12, the source electrode earth conductors 13, the source electrodes 13A, the inner source electrode 13B, the drain fingers 14A, and the gate fingers 15A, similarly to the first application example.

The power amplifying device 100 includes an integrally formed air bridge 130. The air bridge 130 has a center part 130B connected with the inner source electrode 13B, and connection bridges 130A formed on lines connecting the ends of the inner source electrode 13B in the longitudinal direction with the closest earth parts 12 at the shortest distance.

In addition, the air bridge 130 can be integrally formed, or can be formed by connecting the connection bridges 130A to the center part 130B later. The shape of the center part 130B is by no means limited. The center part 130B may also adopt the same shape as the inner source electrode 13B.

The connection bridge 130A is directly connected to each earth part 12. With the example shown in FIG. 3, the air bridge 130 includes four connection bridges 130A. In addition, the number of connection bridges 130A can be increased or decreased within the range of limitation of design.

As described above, with the second application example, the power amplifying device 100 includes the connection bridge 130 which has the center part 130B connected with the inner source electrode 13B, and the connection bridges 130A formed on lines connecting the ends of the inner source electrode 13B in the longitudinal direction with the closest earth parts 12 at the shortest distance.

Consequently, it is possible to make the lengths of the connection bridges 130A the shortest and equal, which provides an effect of further reducing the influence of an inductance.

Figure 3:
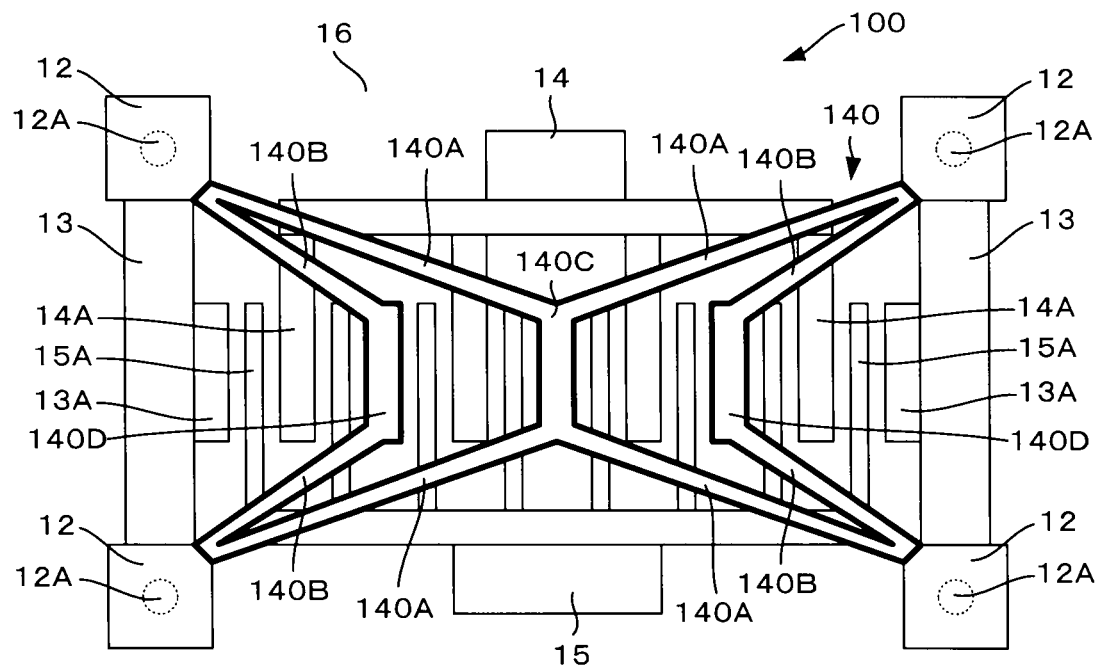
FIG. 3 is a view showing a configuration of a power amplifying device according to a third application example.

FIG. 3 is a view showing a configuration of the power amplifying device 100 according to a third application example of the present embodiment. As shown in FIG. 3, the power amplifying device 100 includes the pairs of earth parts 12 which are connected with the via holes 12A for grounding, the source electrode earth conductors 13 which are provided on the substrate 16 and which connect these pairs of earth parts 12, the source electrodes 13A which are coupled to the source electrode earth conductors 13, inner source electrodes 13B which are not in contact with the source electrode earth conductors 13, the drain electrode 14, the gate electrode 15 and an air bridge 140 which directly connects the inner source electrodes 13B and the earth parts 12.

The drain electrode 14 includes a plurality of drain fingers 14A of a comb shape. The gate electrode 15 includes a plurality of gate fingers of a comb shape.

In addition, in FIG. 3, the inner source electrodes 13B are connected to and hide behind center parts 140C and 140D which will be described below.

The air bridge 140 is formed with a conductor. This conductor contains gold.

The power amplifying device 100 includes at least four earth parts 12. Hence, the power amplifying device 100 includes at least two source electrode earth conductors 13. The power amplifying device 100 includes the source electrode earth conductors 13 in parallel.

The power amplifying device 100 includes the drain fingers 14A having front ends of a comb shape in the drain electrode 14. The power amplifying device 100 includes the gate fingers 15A having front ends of a comb shape in the gate electrode 15. The number of gate fingers 15A is double as many as the number of drain fingers 14A.

The power amplifying device 100 includes two gate fingers 15A between the source electrode 13A and inner source electrode 13B closest to this source electrode 13A and between a pair of adjacent inner source electrodes 13B, respectively, and includes the one drain finger 14A between these two gate fingers 15A.

According to this arrangement, with the example shown in FIG. 3, the power amplifying device 100 includes eight sets of source electrodes, the gate electrodes, and drain electrodes.

The power amplifying device 100 includes the integrally formed air bridge 140. The air bridge 140 has a center part 140C which is connected with the center inner source electrode 13B, the center parts 140D which are connected with left and right inner source electrodes 13B, the connection bridges 140A formed on lines connecting ends of the center inner source electrode 13B in the longitudinal direction with the closest earth parts 12 at the shortest distance, and connection bridges 140B formed on lines connecting ends of the left and right inner source electrodes 13B in the longitudinal direction with the closest earth parts 12 at the shortest distance.

That is, the power amplifying device 100 includes a plurality of inner source electrodes 13B, a plurality of center parts (140C and 140D) and a plurality of connection bridges (140A and 140B).

In addition, the air bridge 140 can be integrally formed, or can be formed by connecting the connection bridges 140A to the center parts 140C and 140D later. The shapes of the center part 140C and the center parts 140D are by no means limited. The center part 140C and center parts 140D may also adopt the same shape as the inner source electrodes 13B.

The connection bridge 140A is directly connected to each earth part 12. With the example shown in FIG. 3, the air bridge 140 includes four connection bridges 140A and four connection bridges 140B in total including two for each of the left and right inner source electrodes 13B. In addition, the number of the connection bridges 140A and the connection bridges 140B can be increased or decreased within the range of limitation of design.

As described above, with the third application example, the power amplifying device 100 includes the connection bridge 140 which has the center parts 140C and 140D connected with the inner source electrodes 13B, and the connection bridges 140A and 140B formed on lines connecting the ends of the inner source electrodes 13B in the longitudinal direction with the closest earth parts 12 at the shortest distance.

Consequently, it is possible to connect all isolated source electrodes with the earth parts 12 at the shortest and equal distances, which provides an effect of further reducing the influence of an inductance even if the number of isolated source electrodes increases.

FIG. 4 is a view showing a configuration of the power amplifying device 100 which can be commonly realized in each application example. FIG. 4 shows the first application example as an example. FIG. 4 is a sectional view showing FIG. 1 from an A-A line.

As shown in FIG. 4, with the power amplifying device 100, the heights h2 of the earth parts 12 and the inner source electrode 13B are equal, and these heights h2 are higher than the heights h1 of the source electrodes 13A, the drain fingers 14A, and the gate fingers 15A.

Hence, when seen from the side view, each air bridge (110, 120, 130, and 140) has a plane shape without an arc.

Consequently, the distances from the inner source electrode 13B to the via holes 12A further become short, so that it is possible to further reduce the influence of an inductance due to arrangement of plating wirings, which provides an effect of preventing a decrease in a gain of a high frequency amplifying device.

Figure 5:
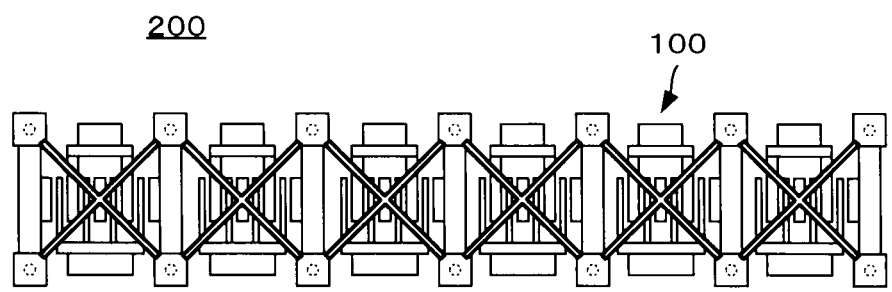
FIG. 5 is a view showing an example of a coupled power amplifying device coupling a plurality of power amplifying devices.

FIG. 5 is a view showing an example of a plurality of coupled power amplifying devices 100 according to each application example. As shown in FIG. 5, a plurality of power amplifying devices 100 according to the present embodiment can be coupled and used. When the power amplifying devices 100 are coupled, two adjacent power amplifying devices 100 are coupled to share the source electrode earth conductor 13 which connects a pair of earth parts 12. A coupled power amplifying device 200 includes a plurality of power amplifying devices 100.

The coupled power amplifying device 200 provides an effect of saving space more than that in a case where a plurality of power amplifying devices 100 is provided.

While certain embodiments have been described, these embodiments have been presented by way of example only, and are not intended to limit the scope of the inventions. Indeed, the novel methods and devices described herein may be embodied in a variety of other forms; furthermore, various omissions, substitutions and changes in the form of the methods and systems described herein may be made without departing from the spirit of the inventions. The accompanying claims and their equivalents are indeed to cover such forms or modifications as would fall within the scope and spirit of the inventions.

What is claimed is:

1. A power amplifying device comprising:
   a drain electrode which is provided on a substrate;
   a plurality of drain fingers which is connected to the drain electrode and which have front ends branched in a comb shape;
   a gate electrode which faces the drain electrode and which is provided on the substrate;
   a plurality of gate fingers which is connected to the gate electrode and which is arranged on both sides of each of the drain fingers;
   source electrodes which are arranged in parallel outside the gate fingers;
   source electrode earth conductors which are connected to respective of the source electrodes which are arranged outside the gate fingers arranged at both ends of the gate electrode, and which are arranged in parallel to the source electrodes;
   a pair of earth parts which is connected to both ends of the source electrode earth conductor and which is connected with via holes for grounding;
   an inner source electrode of the source electrodes which is arranged between a pair of the source electrode earth conductors; and
   an air bridge which is disposed diagonally in relation to a longitudinal direction of the inner source electrode and directly connects the inner source electrode and the earth parts at a shortest distance.

2. The power amplifying device according to claim 1, wherein the air bridge connects the inner source electrode and the earth parts such that distances between a center of the inner source electrode in a longitudinal direction and the via holes are the shortest distances.

3. The power amplifying device according to claim 2, wherein the air bridge further has a center part which is connected with the inner source electrode and which is connected to the earth parts.

4. The power amplifying device according to claim 3, wherein the air bridge has a plurality of center parts.

5. The power amplifying device according to claim 1, wherein the air bridge connects the inner source electrode and the earth parts such that distances between an end of the inner source electrode in a longitudinal direction and the via holes are the shortest distances.

6. The power amplifying device according to claim 5, wherein the air bridge further has a center part which is connected with the inner source electrode and which is connected to the earth parts.

7. The power amplifying device according to claim 6, wherein the air bridge includes a plurality of the center parts.

8. The power amplifying device according to claim 1, wherein heights of the earth parts and the inner source electrode are higher than heights of the source electrodes, the drain fingers, and the gate fingers.

9. A coupled power amplifying device which couples two adjacent power amplifying devices to share a source electrode earth conductor, the coupled power amplifying device comprising:
   a drain electrode which is provided on a substrate;
   a plurality of drain fingers which is connected to the drain electrode and which has front ends branched in a comb shape;
   a gate electrode which faces the drain electrode and which is provided on the substrate;
   a plurality of gate fingers which is connected to the gate electrode and which is arranged on both sides of each of the drain fingers;
   source electrodes which are arranged in parallel outside the gate fingers;
   source electrode earth conductors which are connected to respective of the source electrodes which are arranged outside the gate fingers arranged at both ends of the gate electrode, and which are arranged in parallel to the source electrodes;

a pair of earth parts which is connected to both ends of the source electrode earth conductor and which is connected with via holes for grounding;

an inner source electrode of the source electrodes which is arranged between a pair of the source electrode earth conductors; and an air bridge which is disposed diagonally in relation to a longitudinal direction of the inner source electrode and directly connects the inner source electrode and the earth parts of a shortest distance.

* * * * *